United States Patent
Zhu et al.

(10) Patent No.: US 9,614,550 B2
(45) Date of Patent: Apr. 4, 2017

(54) PARALLEL BCH CODING CIRCUIT, ENCODER AND METHOD

(71) Applicant: RAMAXEL TECHNOLOGY (SHENZHEN) LIMITED, Shenzhen (CN)

(72) Inventors: Lijuan Zhu, Shenzhen (CN); Haifeng Mo, Shenzhen (CN)

(73) Assignee: RAMAXEL TECHNOLOGY (SHENZHEN) LIMITED, Shenzhen (CN)

( * ) Notice: Subject to any disclaimer, the term of this patent is extended or adjusted under 35 U.S.C. 154(b) by 228 days.

(21) Appl. No.: 14/409,982

(22) PCT Filed: Jun. 18, 2013

(86) PCT No.: PCT/CN2013/077379
§ 371 (c)(1),
(2) Date: Apr. 8, 2015

(87) PCT Pub. No.: WO2013/189274
PCT Pub. Date: Dec. 27, 2013

(65) Prior Publication Data
US 2015/0222296 A1    Aug. 6, 2015

(30) Foreign Application Priority Data

Jun. 20, 2012    (CN) .......................... 2012 1 0204547

(51) Int. Cl.
*H03M 13/39* (2006.01)
*H03M 13/15* (2006.01)
*H03M 13/00* (2006.01)

(52) U.S. Cl.
CPC ..... *H03M 13/3961* (2013.01); *H03M 13/152* (2013.01); *H03M 13/611* (2013.01);
(Continued)

(58) Field of Classification Search
CPC .. H03M 13/15; H03M 13/152; H03M 13/156; H03M 13/159; H03M 13/1595;
(Continued)

(56) References Cited

U.S. PATENT DOCUMENTS

| 6,640,327 B1 * | 10/2003 | Hallberg | H03M 13/152 |
| | | | 714/758 |
| 2013/0254639 A1 * | 9/2013 | Krishnan | H03M 13/13 |
| | | | 714/800 |

FOREIGN PATENT DOCUMENTS

| CN | 101227194 A | 7/2008 |
| CN | 201898502 U | 7/2011 |

(Continued)

*Primary Examiner* — Sam Rizk
*Assistant Examiner* — Christian Dorman
(74) *Attorney, Agent, or Firm* — Mashoff Brennan

(57) ABSTRACT

The present invention is applicable to the field of error correction coding, and provides a circuit, an encoder and a method for parallel BCH coding. The method comprises: performing an XOR operation on input sequences $\{m(p-1), m(p-2), \ldots, m(0)\}$ in a current period in sequence corresponding to output upper bits of the previous period of a register separately, outputting operation results as selection signals to a selector, selecting P constant-multinomials $\{xr<<0) \bmod g(x), (xr<<1) \bmod g(x), \ldots, (xr<<(p-1)) \bmod g(x)\}$ with 0 separately in sequence, shifting the selection results and the output of the previous period of the register in P bits towards the upper bits and outputting the selection results, summing the selection results and outputting the sum to the register to serve as an output of the current period of the register; the above steps are repeated specific times to obtain final code output.

3 Claims, 6 Drawing Sheets

(52) U.S. Cl.
CPC ...... *H03M 13/6561* (2013.01); *H03M 13/159* (2013.01); *H03M 13/1595* (2013.01)

(58) Field of Classification Search
CPC ........... H03M 13/3961; H03M 13/611; H03M 13/6561; H03M 13/05; H03M 13/13; G06F 11/08; G06F 11/085; G06F 11/10; G06F 11/1004
See application file for complete search history.

(56) References Cited

FOREIGN PATENT DOCUMENTS

| | | |
|---|---|---|
| CN | 102820892 A | 12/2012 |
| WO | 2004059851 A1 | 7/2004 |
| WO | 2004107587 A1 | 12/2004 |

\* cited by examiner

PARALLEL BCH CODING CIRCUIT, ENCODER AND METHOD

TECHNICAL FIELD

The present invention relates to the field of error correction coding, and particularly to a circuit, an encoder and a method for parallel BCH coding.

BACKGROUND ART

As an important method for error correction coding, BCH codes have been widely used in the fields of communications and consumer electronics. The term "BCH code" is an abbreviation for Bose, Ray-Chaudhuri and Hocquenghem. The BCH code is a cyclic code for correcting a plurality of random errors, and it can be described by the root of a generator polynomial g(x). With the development of technology, people are increasingly demanding higher and higher error correction capability of BCH and, accordingly, people are much more sensitive to the performance of BCH codecs. There are mainly two kinds of BCH coding. One is serial coding, and the other is parallel coding. Serial coding is generally used in situations where speeds are not required to be high, because serial coding saves the most of area. However, in situations where speeds are required to be very high, parallel coding needs to be used.

At present, the parallel coding method commonly used comprises carrying out BCH coding by a linear feedback shift register (LFSR) method, as shown in FIG. 1. However, as the error correction capability and data bandwidths are constantly increasingly, it is often difficult for the parallel LFSR structure used in a BCH encoder to satisfy the clock frequency, due to a path which is too long. The patent application No. 200810065971.9 discloses "a circuit, an encoder and a method for parallel BCH coding", which use a parallel iteration coding circuit comprising several constant vector multipliers, a constant matrix multiplier and some XOR gates. Although the fan-out of such circuit is controlled compared with the LFSR structure, the multipliers occupy a too large area.

To sum up, it is evident that the existing BCH coding circuits are inconvenient and have defects in practical applications, thus it is necessary to improve them.

DISCLOSURE OF THE INVENTION

To overcome the above-mentioned defects, it is an object of the present invention to provide a circuit, an encoder and a method for parallel BCH coding, which can effectively shorten the path, thereby enabling the timing performance of the circuit to be better, avoiding the problem that the LFSR structure cannot meet the timing requirements since the path is too long when the clock frequency is increasing, and saving the area at the same time.

To this end, the present invention provides a circuit for parallel BCH coding, characterized by comprising P input branches, a register, and a Galois field adder connected to said P input branches and said register, P being a degree of parallelism, each said input branch comprising a selector and an XOR gate, the output of said XOR gate serving as the selection signal of said selector, and the output of said selector being the output of each said input branch, wherein input sequences $\{m(p-1), m(p-2), \ldots, m(0)\}$ in a current period in sequence corresponding to output upper bits of the previous period of said register separately are input to P XOR gates, the operation result of said XOR gate is output to said selector, P constant-multinomials $\{x^r{<<}0) \bmod g(x), (x^r{<<}1) \bmod g(x), \ldots, (x^r{<<}(p-1)) \bmod g(x)\}$ with 0 separately in sequence are input to P selectors and are selected, and the selection results serve as a first output, wherein the output of the previous period of said register is shifted in P bits towards the upper bits to serve as a second output, wherein the first and second outputs are summed in the Galois field, and the sum is output to said register to serve as an output of the current period of said register, and wherein a specific number of operations are performed on said P branches, said adder and said register to obtain final code output.

In accordance with the circuit according to the present invention, said specific number is determined by the length K of the input information data and the degree of parallelism P, and said specific number is the minimum integer not less than K/P.

Accordingly, the present invention provides an encoder comprising said circuit.

Accordingly, the present invention provides a method for parallel BCH coding, characterized by comprising:

performing an XOR operation on input sequences $\{m(p-1), m(p-2), \ldots, m(0)\}$ in a current period in sequence corresponding to output upper bits of the previous period of a register separately, outputting operation results as selection signals to a selector, selecting P constant-multinomials $\{x^r{<<}0) \bmod g(x), (x^r{<<}1) \bmod g(x), \ldots, (x^r{<<}(p-1)) \bmod g(x)\}$ with 0 separately in sequence, and using the selection results as a first output;

shifting the output of the previous period of said register in P bits towards the upper bits to serve as a second output;

summing the first and second outputs in the Galois field and outputting the sum to said register to serve as an output of the current period of said register; and repeating the above steps specific times to obtain final code output.

In accordance with the method according to the present invention, said specific number is determined by the length K of the input information data and the degree of parallelism P, and said specific number is the minimum integer not less than K/P.

The present invention further provides a circuit for parallel BCH coding, characterized by comprising an input remainder module, a register, and a Galois field adder connected to said input remainder module and said register, wherein, during a clock period, the output of said circuit is the information bit of P bit, said information bit is input to said remainder module to serve as a first output and, at the same time, the output of the previous period of said register is shifted in P bits towards the upper bits to serve as a second output, and wherein the first and second outputs are summed in the Galois field, the sum is output to said register, the results are saved in said register, and after a specific number of iterations, the final code output is obtained.

In accordance with the circuit according to the present invention, said specific number is determined by the length K of the input information data and the degree of parallelism P, and said specific number is the minimum integer not less than K/P.

The present invention further correspondingly provides an encoder comprising said circuit.

The present invention further correspondingly provides a method for parallel BCH coding, characterized by comprising:

during a clock period, making the output of a circuit be the information bit of P bit, and inputting said information bit to a remainder module to serve as a first output;

shifting the output of the previous period of said register in P bits towards the upper bits to serve as a second output;

summing the first and second outputs in the Galois field, outputting the sum to a register, and saving the results in said register; and performing a specific number of iterations in said steps to obtain final code output.

In accordance with the method according to the present invention, said specific number is determined by the length K of the input information data and the degree of parallelism P, and said specific number is the minimum integer not less than K/P.

The circuit, encoder and method for parallel BCH coding as provided by the present invention select constant-multinomials by iterative algorithm and by a look-up table method. At a very high operating frequency, compared with a traditional LFSR structure, the circuit, encoder and method of the present invention can effectively shorten the path, thereby enabling the timing performance of the circuit to be better, and avoiding the problem that the LFSR structure cannot meet the timing requirements since t is too large when the clock frequency is increasing. Moreover, much area is saved because the circuit is so simple that it only has several selectors and some XOR gates. Accordingly, by means of the present invention, the path can be effectively shortened, thereby enabling the timing performance of the circuit to be better, avoiding the problem that the LFSR structure cannot meet the timing requirements since the path is too long when the clock frequency is increasing, and saving the area at the same time.

EMBODIMENTS

To make the object, technical solutions and advantages of the present invention more clear, the present invention is further described in detail hereinafter with reference to the accompanying drawings and embodiments. It should be appreciated that the specific embodiments described herein are only intended to illustrate the present invention but not to limit it.

Figure 1:
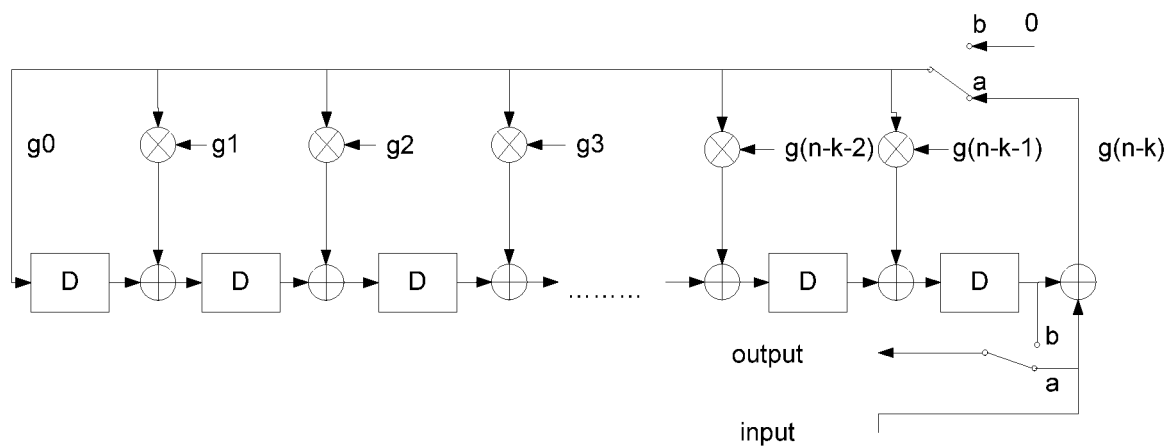
FIG. 1 is a circuit diagram of a BCH encoder with a traditional serial LFSR structure.
Figure 2:
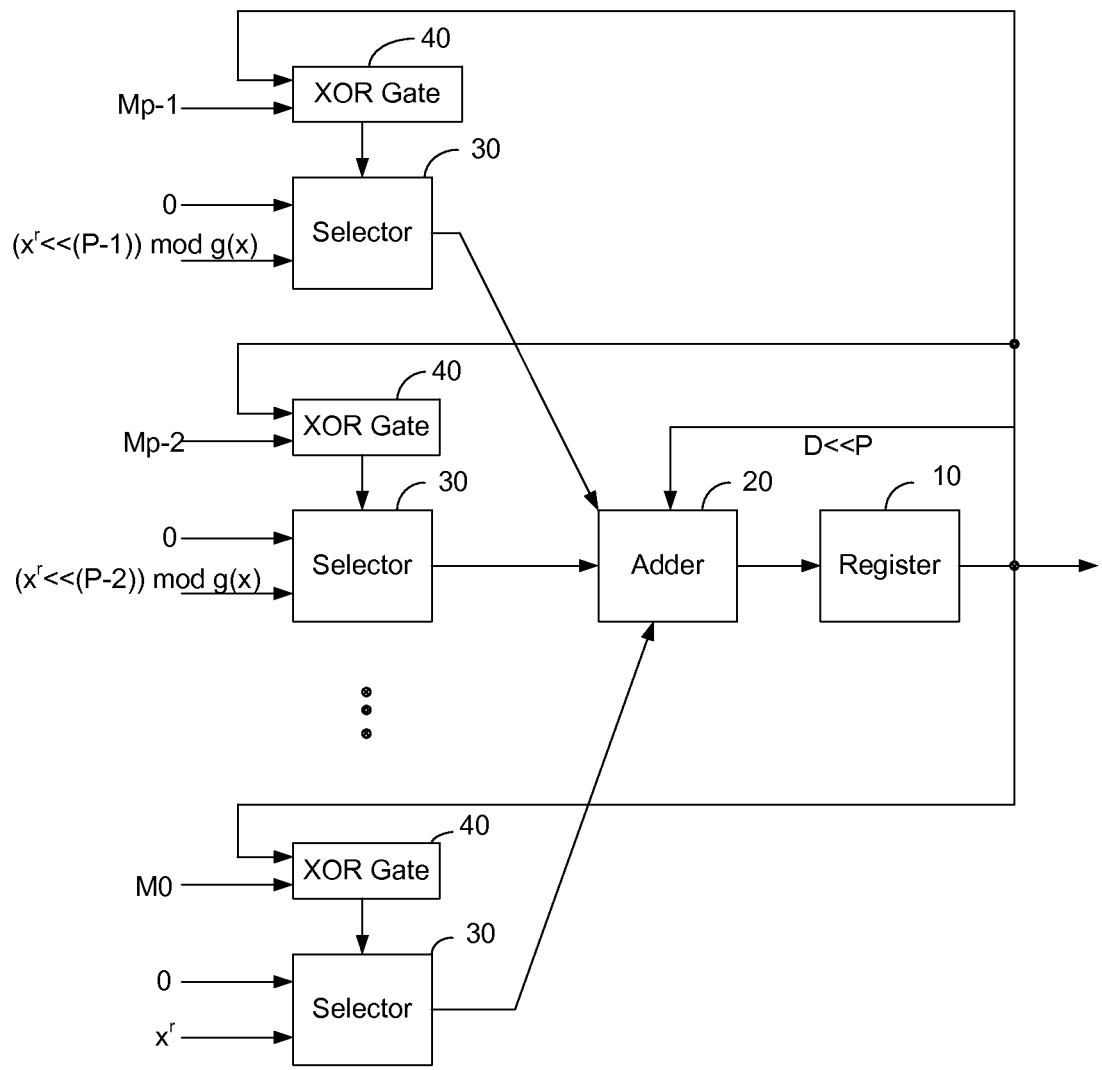
FIG. 2 is a principle diagram of a circuit for parallel BCH coding.
Figure 3:
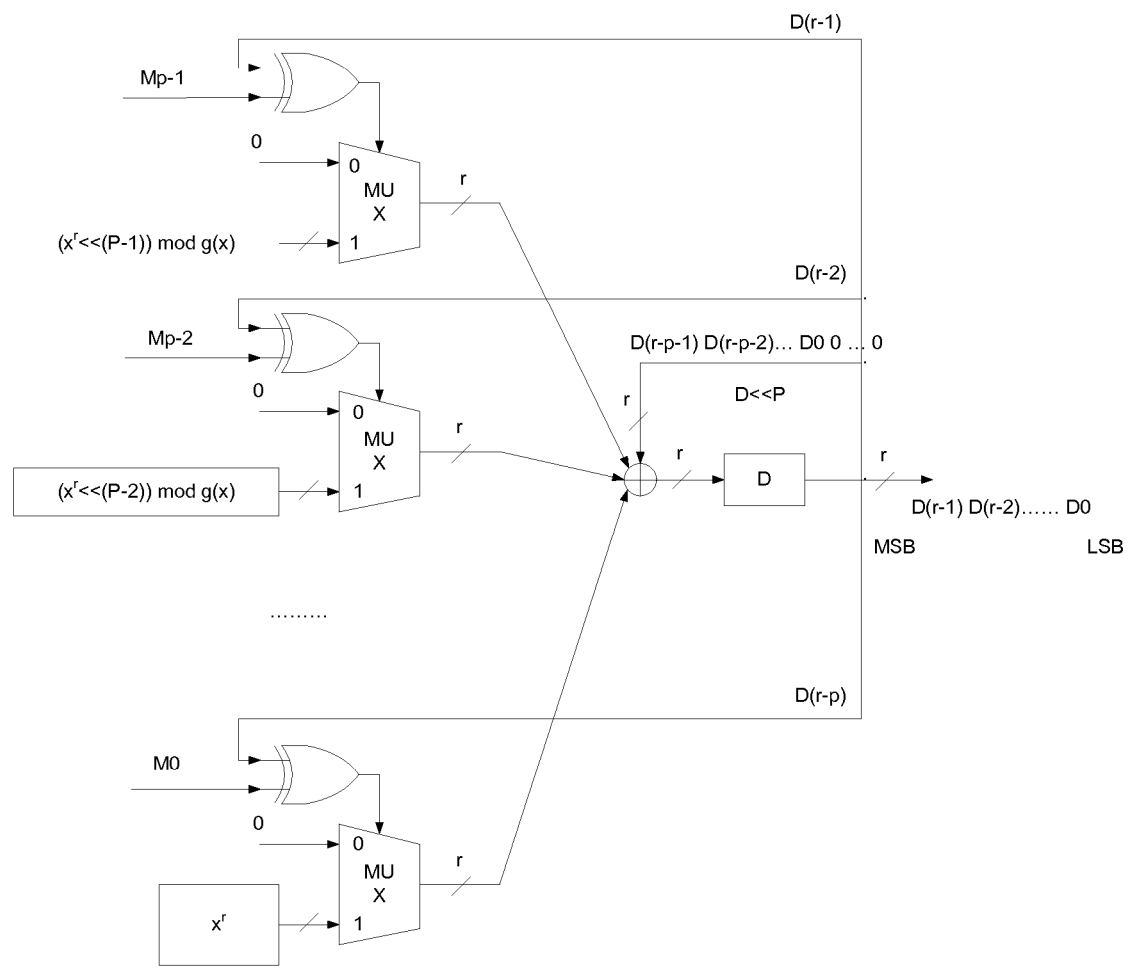
FIG. 3 is a structure diagram of an embodiment of a circuit for parallel BCH coding.

As shown in FIGS. 2 and 3, a circuit for parallel BCH coding according to the present invention for use in an encoder comprises P input branches, a register 10, and a Galois field adder 20 connected to said P branches and said register 10, wherein P is a degree of parallelism, each said input branch comprises a selector 30 and an XOR gate 40, the output of said XOR gate 40 serves as the selection signal of said selector 30, the output of said selector 30 is controlled by the selection signal, and the output of said selector 30 is the output of each said input branch.

Input sequences $\{m(p-1), m(p-2), \ldots, m(0)\}$ in a current period in sequence corresponding to output upper bits of the previous period of said register 10 separately are input to P XOR gates 40, the operation result of said XOR gate 40 is output to said selector 30, P constant-multinomials $\{x^r<<0) \bmod g(x), (x^r<<1) \bmod g(x), \ldots, (x^r<<(p-1)) \bmod g(x)\}$ with 0 separately in sequence are input to P selectors 30 and are selected, and the selection results serve as a first output; the output of the previous period of said register 10 is shifted in P bits towards the upper bits to serve as a second output; the first and second outputs are summed in the Galois field, and the sum is output to said register 10 to serve as an output of the current period of said register 10; and a specific number of operations are performed on said P branches, said adder 20 and said register 10 to obtain final code output. Said specific number is determined by the length K of parallelism P of the input information data and the degree, and said specific number is the minimum integer not less than K/P.

The present invention selects constant-multinomials by iterative algorithm and by a look-up table method. At a very high operating frequency, compared with a traditional LFSR structure, the circuit, encoder and method of the present invention can effectively shorten the path, thereby enabling the timing performance of the circuit to be better, and avoiding the problem that the LFSR structure cannot meet the timing requirements since t is too large when the clock frequency is increasing. Moreover, much area is saved because the circuit is so simple that it only has several selectors and some XOR gates. Accordingly, by means of the present invention, the path can be effectively shortened, thereby enabling the timing performance of the circuit to be better, avoiding the problem that the LFSR structure cannot meet the timing requirements since the path is too long when the clock frequency is increasing, and saving the area at the same time.

The specific design principle of the present invention is as follows:

Assuming that the code length is n, the input of the information bit of k bit is:

$m(x)=m(k-1)x^{k-1}+m(k-2)x^{k-2}+\ldots+m(1)x+m(0)$, the generator polynomial is $g(x)$, the parity bit of the output $r=n-k$ bit is $d(x)$, and then, according to the coding theory of BCH, $$m(x)*x^r = b*g(x) + d(x) \tag{A1}$$

wherein b is the quotient obtained after $m(x)*x^r$ is divided by $g(x)$, and $d(x)$ is the remainder. The $m(x)$ is substituted to give:

$$\begin{aligned}(m(k-1)x^{k-1}+m(k-2)x^{k-2}+\ldots+m(1)x+m(0))*x^r = \\ b*g(x)+d(x)m(k-1)x^r x^{k-1}+m(k-2)x^r \\ x^{k-2}+\ldots+m(1)x^r x+m(0)x^r = b*g(x)+d(x)\end{aligned} \tag{A2}$$

The process of obtaining a parity bit is a process of obtaining the remainder of $g(x)$ in the left end of the equation (A2). Therefore, the parity bit can be obtained by the following equation:

$$d(x)=(m(k-1)x^r x^{k-1}+m(k-2)x^r x^{k-2}+\ldots+m(1)x^r x+m(0)x^r)\bmod g(x) \tag{A3}$$

Assuming that the parallel coefficient is p, then the equation (A3) is converted to:

$$\begin{aligned}d(x)=(\ldots((m(k-1)x^r x^{p-1}+m(k-2)x^r x^{p-2}+\ldots+m(k-p)x^r)*x^p+m(k-p-1)x^r x^{p-1}+m(k-p-2) \\ x^r x^{p-2}+\ldots+m(k-p-p)x^r)*x^p+\ldots+m(p-1) \\ x^r x^{p-1}+m(p-2)x^r x^{p-2}+\ldots+m(0)x^r)\bmod g(x)\end{aligned} \tag{A4}$$

Assuming that $s(a)=m(k-a-1) \; x^r \; x^{p-1}+m(k-a-2) \; x^r \; x^{p-2}+ \ldots +m(k-a-p) \; x^r$, then the above equation (A4) can be written as:

$$d(x) = (\ldots(s(0)*x^p + s(p))*x^p + \ldots + s(k-p)) \bmod g(x) \quad (A5)$$

$$= (\ldots((s(0)*x^p) \bmod g(x) + s(p) \bmod g(x))*x^p) \bmod g(x) +$$

$$\ldots + s(k-p) \bmod g(x)) \bmod g(x)$$

$$= (\ldots((s(0) \bmod g(x)*x^p) \bmod g(x) + s(p) \bmod g(x))*$$

$$x^p) \bmod g(x) + \ldots + s(k-p) \bmod g(x)) \bmod g(x)$$

Assuming that $t(a)=s(a) \bmod g(x)$, then the above equation can be written as:

$$d(x)=((\ldots((((t(0)<<p) \bmod g(x))+t(p))<<p) \bmod g(x)+ \ldots ) \bmod g(x))+t(k-p) \quad (A6)$$

Figure 4:
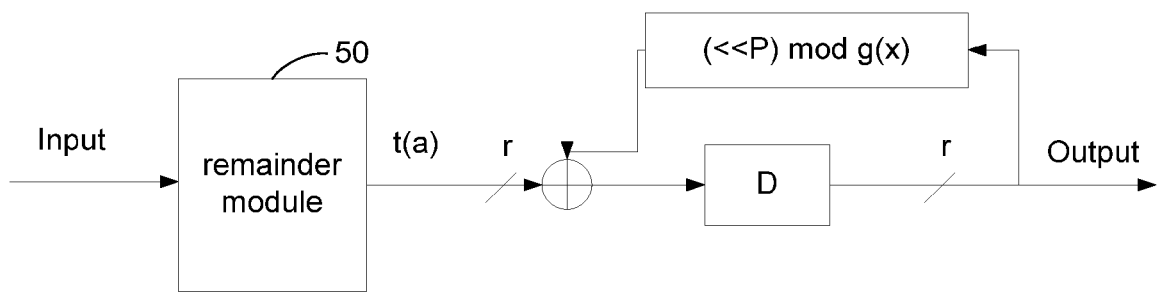
FIG. 4 is a logic diagram of a circuit for parallel BCH coding.

The equation (A6) may be converted to a circuit as shown in FIG. 4. In the equation (A6), t(x) is a value of the register, and during a clock period, the output of said circuit is the information bit of P bit, said information bit is input to a remainder module 50 to serve as a first output; meanwhile, after the output of the previous period of said register is shifted in P bits towards the upper bits, the result of obtaining the remainder of a generator polynomial serves as a second output; the two outputs are together summed in the Galois field, the sum is output to said register, the results are saved in said register, and after a certain number of iterations in this way, the register, to which all the information bits of k bits have been input, outputs a parity bit, namely the result of the BCH encoder. Thus, the coding process is converted to a process of obtaining the remainder of a polynomial, i.e., $t(a)=s(a) \bmod g(x)$; in other words, an input remainder module 50 is designed, and the s(a) polynomial is substituted into t(a) to obtain:

$$t(a) = s(a) \bmod g(x) \quad (A7)$$

$$= (m(k-a-1)x^r x^{p-1} + m(k-a-2)x^r x^{p-2} + \ldots +$$

$$m(k-a-p)x^r) \bmod g(x)$$

$$= ((m(k-a-1)x^r x^{p-1}) \bmod g(x) +$$

$$(m(k-a-2)x^r x^{p-2}) \bmod g(x) + \ldots +$$

$$(m(k-a-p)x^r) \bmod g(x)) \bmod g(x)$$

$$= (m(k-a-1)*((x^r \ll (p-1)) \bmod g(x)) + m(k-a-2)*$$

$$((x^r \ll (p-2)) \bmod g(x)) + \ldots + m(k-a-p)*x^r)$$

Figure 5:
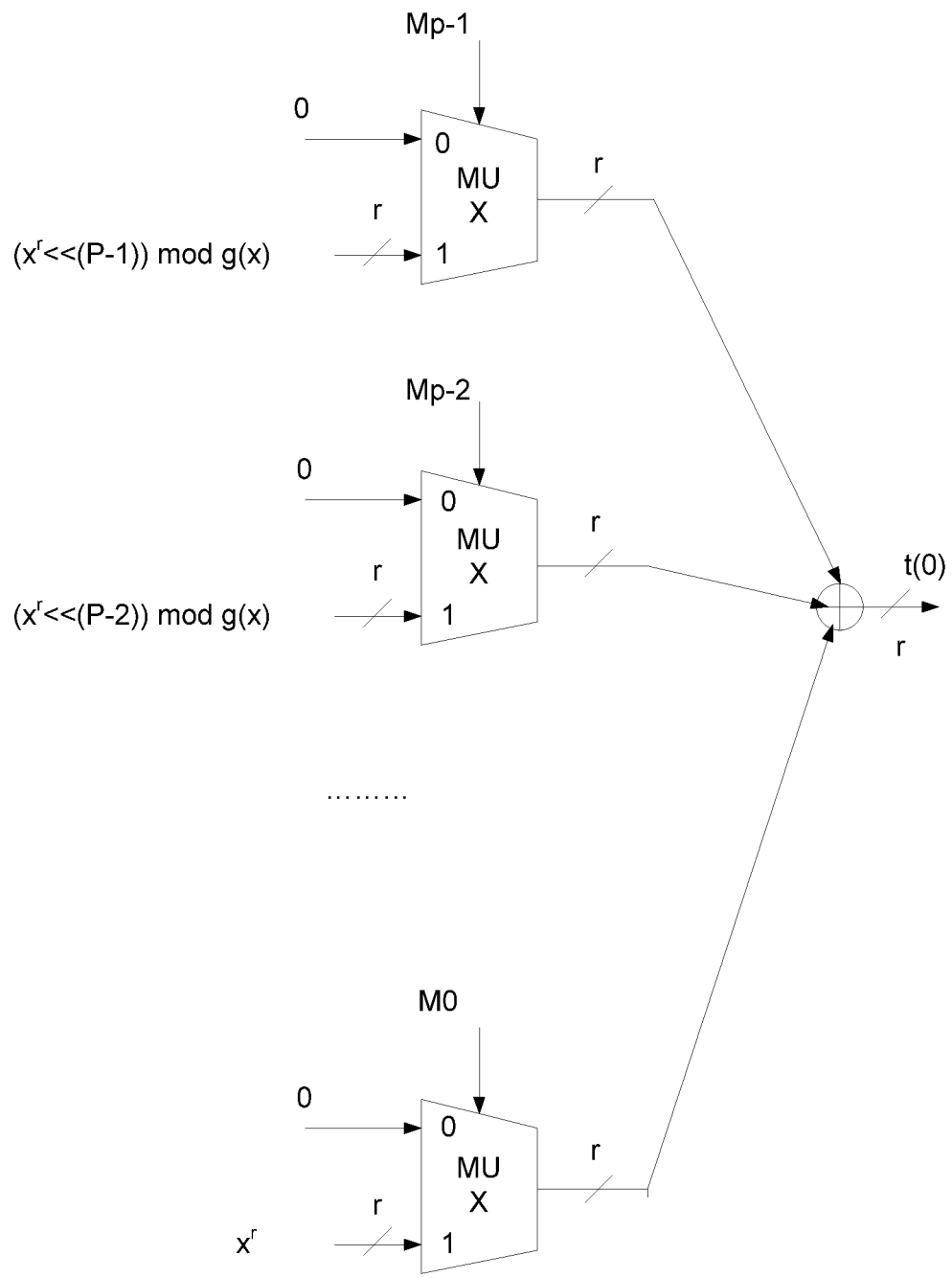
FIG. 5 is a structure diagram of an input remainder module of a circuit for parallel BCH coding.

Both the algorithm of remainder operations and the algorithm in the Galois field are employed in the process of forming the equations. In this way, the operation as shown by the above polynomial (A7) is converted into a circuit, as shown in FIG. 5. The circuit, during a clock period, inputs p bits, which are $\{m(p-1), m(p-2), \ldots, m(0)\}$, respectively, and which serve as the respective selection signals of the selectors; the selectors have an input in common, namely 0, and differ from each other in the other input, and the other inputs are P multinomials $\{x^r \ll 0) \bmod g(x), (x^r \ll 1) \bmod g(x), \ldots, (x^r \ll (p-1)) \bmod g(x)\}$, respectively. Apparently, all these P multinomials are constant-multinomials after their error correction capabilities are determined Moreover, in FIG. 4, $(dout \ll p) \bmod g(x)$ can be calculated using these P constant-multinomials as mentioned above:

$(dout \ll p) \bmod g(x) = (dout[r-1] \& ((x^r \ll (p-1)) \bmod g(x))) + (dout[r-2] \& ((x^r \ll (p-2)) \bmod g(x))) + \ldots + (dout[r-p] \& ((x^r \ll 0) \bmod g(x))) + \{dout[r-p-1:0], p'b0\}$ That is to say, the upper p-bits of the output value of the register and the output of the next period are together used as the selection signals of P constant-multinomials and, in the meanwhile, the output value of the register is arithmetically shifted in P bits leftwards (shifted towards the upper bits), the result obtained by shifting leftwards and the output results of all the selectors are summed in the Galois field, and the sum is input to the register to thereby obtain a final coding result.

In summary, FIG. 4 combined with FIG. 5 constitutes the entire BCH encoder, and assuming that the length of information is k and the degree of parallelism of the circuit is p, then after a k/p number of iterations, the output value of the register is the output of a parity bit, as shown in FIG. 3. If k is not divisible by p, then 0 should be filled in the lower bit in the input of p bit during the last clock period. The embodiment is as follows:

1. A reset signal is sent from outside to clear the register.
2. Each of input sequences $\{m(p-1), m(p-2), \ldots, m(0)\}$ is input in sequence as one selection signal to each selector of the encoder, and the other selection signal of each said selector is the output upper bits of the previous period of the register.
3. The result obtained after the output of the previous period of the register is shifted in p bits towards the upper bits serves as a second output; the two outputs are together summed in the Galois field, and the sum is output to the register.
4. The processes Nos. 2 and 3 loop continuously. In each period, the values of the register will be updated and participate in the operations in the next period, until all the information bits are completely input. Thus, the serially output values of the register are added to the input information sequence to thereby obtain a codeword after BCH coding.

By means of the present invention, 16 paths can operate in parallel at a frequency of 400 MHz, as evidence by experiments. Moreover, since the mechanism is different from the traditional LFSR, the higher the operating frequency, the more obvious advantages as compared to the LFSR structure, as shown in Table 1. Table 1 shows a performance comparison between the present invention and the traditional parallel LFSR structure when the length of information bit is 2 KB and the error correction capability is 80. According to an analysis under the same conditions, the present invention is only slightly superior to the LFSR structure in terms of area at an operating frequency of 100 MHz; however, if the operating frequency is increased to 400 MHz, the traditional LFSR structure with 16 paths in parallel cannot possibly be verified by the timing, while the present invention can be easily verified, and the area is the same as the area at a frequency of 100 MHz though the frequency is increased by four times, i.e., the advantages are quite obvious.

TABLE 1

| Clock Frequency (MHz) | 400 | 100 |
|---|---|---|
| 16-path parallel LFSR structure (square microns) | N/A | 57506 |
| 16-path parallel structure of the present invention (square microns) | 51486 | 52805 |

Figure 6:
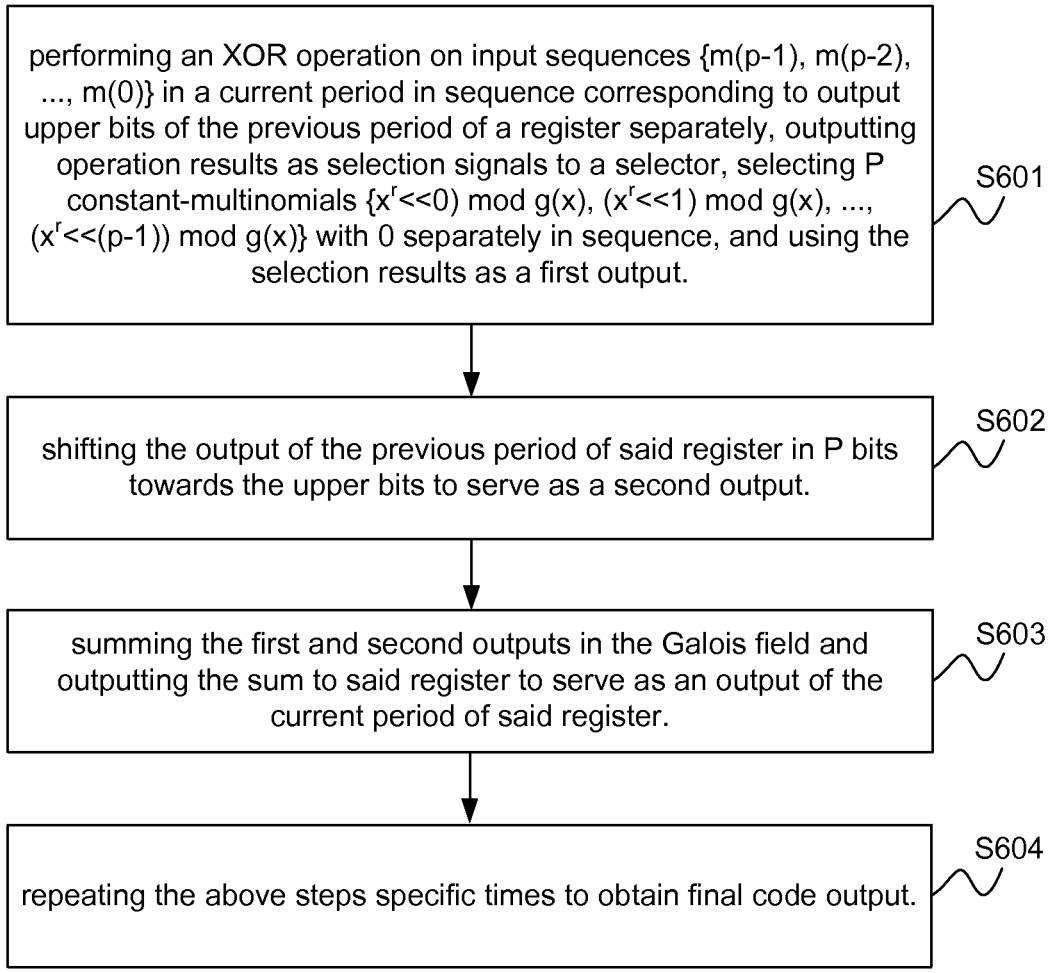
FIG. 6 is a flow chart of a method for parallel BCH coding.

As shown in FIG. 6, the present invention accordingly provides a method for parallel BCH coding, which is carried out by the encoder as shown in FIG. 2 and which method comprises:

Step S601: performing an XOR operation on input sequences {m(p−1), m(p−2), ..., m(0)} in a current period in sequence corresponding to output upper bits of the previous period of a register separately, outputting operation results as selection signals to a selector, selecting P constant-multinomials {($x^r$<<0) mod g(x), ($x^r$<<1) mod g(x), ..., ($x^r$<<(p−1)) mod g(x)} with 0 separately in sequence, and using the selection results as a first output. This step is performed by the selector 30, the XOR gate 40 and the register 10.

Step S602: shifting the output of the previous period of said register in P bits towards the upper bits to serve as a second output. This step is performed by the register 10.

Step S603: summing the first and second outputs in the Galois field and outputting the sum to said register to serve as an output of the current period of said register. This step is performed by the register 10 and the adder 20.

Step S604: repeating the above steps specific times to obtain final code output.

The present invention also provides another circuit for parallel BCH coding, comprising an input remainder module, a register, and a Galois field adder connected to said input remainder module and said register, wherein, during a clock period, the output of said circuit is the information bit of P bit, said information bit is input to said remainder module to serve as a first output and, at the same time, the output of the previous period of said register is shifted in P bits towards the upper bits to serve as a second output, and wherein the first and second outputs are summed in the Galois field, the sum is output to said register, the results are saved in said register, and after a specific number of iterations, the final code output is obtained. Said specific number is determined by the length K of the input information data and the degree of parallelism P, and said specific number is the minimum integer not less than K/P. The specific principle of the circuit for parallel BCH coding has been described in detail hereinbefore, and no more details will be provided here.

The present invention also provides another method for parallel BCH coding, comprising: during a clock period, making the output of a circuit be the information bit of P bit, and inputting said information bit to a remainder module to serve as a first output; shifting the output of the previous period of said register in P bits towards the upper bits to serve as a second output; summing the first and second outputs in the Galois field, outputting the sum to a register, and saving the results in said register; and performing a specific number of iterations in said steps to obtain final code output. The specific principle of the method for parallel BCH coding has been described in detail hereinbefore, and no more details will be provided here.

In summary, the circuit, encoder and method for parallel BCH coding as provided by the present invention select constant-multinomials by iterative algorithm and by a look-up table method. At a very high operating frequency, compared with a traditional LFSR structure, the circuit, encoder and method of the present invention can effectively shorten the path, thereby enabling the timing performance of the circuit to be better, and avoiding the problem that the LFSR structure cannot meet the timing requirements since t is too large when the clock frequency is increasing. Moreover, much area is saved because the circuit is so simple that it only has several selectors and some XOR gates. Accordingly, by means of the present invention, the path can be effectively shortened, thereby enabling the timing performance of the circuit to be better, avoiding the problem that the LFSR structure cannot meet the timing requirements since the path is too long when the clock frequency is increasing, and saving the area at the same time.

Of course, the present invention may have a variety of other embodiments. Those skilled in the art can make all kinds of corresponding changes and modifications according to the present invention without departing from the spirit and essence of the present invention. It is intended that all these changes and modifications be covered by the appended claims of the present invention.

The invention claimed is:

1. A circuit for parallel BCH coding, comprising:
   a plurality of P input branches, wherein P is a number indicative of a degree of parallelism, each of said input branches including:
      a selector; and
      an XOR gate, wherein an output of said XOR gate serves as a selection signal of said selector, and an output of said selector is an output of each said input branch;
   a register; and
   a Galois field adder connected to said P input branches and said register;
   wherein input sequences {m(p−1), m(p−2), ..., m(0)} in a current period in sequence corresponding to output upper bits of a previous period of said register separately are input to each of the P XOR gates, an output of each of the P XOR gates is output to a corresponding one of P selectors, P constant-multinomials {($x^r$<<0) mod g(x), ($x^r$<<1) mod g(x), ..., ($x^r$<<(p−1)) mod g(x)} with 0 separately in sequence are input to the P selectors and are selected, and the selection results serve as a first output, wherein $x^r$ is a multinomial of which the highest power is r, m is an input sequence, and g(x) is a generator polynomial;
   wherein an output of the previous period of said register is shifted in P bits towards the upper bits to serve as a second output;
   wherein the first and second outputs are summed in the Galois field adder, and the sum is output to said register to serve as an output of the current period of said register;
   wherein a specific number of operations are performed on said P input branches, said Galois field adder and said register to obtain final code output; and
   wherein said specific number is determined by a length K, wherein K is a number indicative of length of input information data and the degree of parallelism P, and said specific number is the minimum integer not less than K/P.

2. The circuit for parallel BCH coding according to claim 1, wherein the circuit for parallel BCH coding further comprises an encoder.

3. A method for parallel BCH coding, comprising:
   performing an XOR operation on input sequences {m(p−1), m(p−2), ..., m(0)} in a current period in sequence corresponding to output upper bits of a previous period of a register separately;
   outputting operation results as selection signals to a selector;
   selecting P constant-multinomials {($x^r$<<0) mod g(x), ($x^r$<<1) mod g(x), ..., ($x^r$<<(p−1)) mod g(x)} with 0 separately in sequence, wherein P is a number indicative of a degree of parallelism, $x^r$ is a multinomial of which the highest power is r, m is an input sequence, and g(x) is a generator polynomial;
using selection results as a first output;
shifting an output of the previous period of said register in P bits towards the upper bits to serve as a second output;
summing the first and second outputs in a Galois field and outputting the sum to said register to serve as an output of the current period of said register; and
repeating the above steps a specific number of times to obtain final code output
wherein said specific number is determined by a length K, wherein K is a number indicative of length of input information data, P is the number indicative of the degree of parallelism, and said specific number is the minimum integer not less than K/P.

* * * * *